US006939764B2

(12) United States Patent
Chen et al.

(10) Patent No.: US 6,939,764 B2
(45) Date of Patent: Sep. 6, 2005

(54) METHODS OF FORMING MEMORY CELLS HAVING SELF-ALIGNED SILICIDE

(75) Inventors: Chun Chen, Boise, ID (US); Graham Wolstenholme, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 10/602,324

(22) Filed: Jun. 24, 2003

(65) Prior Publication Data

US 2005/0009272 A1 Jan. 13, 2005

(51) Int. Cl.[7] .............................................. H01L 21/336

(52) U.S. Cl. ....................... 438/258; 438/257; 438/264; 438/267; 438/266; 438/592; 438/593; 257/413; 257/414; 257/415

(58) Field of Search ................................. 438/257–258, 438/592–593, 264–266; 257/314, 313, 315

(56) References Cited

U.S. PATENT DOCUMENTS

| | | | |
|---|---|---|---|
| 5,770,507 A | 6/1998 | Chen et al. | |
| 6,194,279 B1 | 2/2001 | Chen et al. | |
| 6,204,129 B1 | 3/2001 | Hwang et al. | |
| 6,207,492 B1 | 3/2001 | Tzeng et al. | |
| 6,245,626 B1 | 6/2001 | Chen et al. | |
| 6,291,354 B1 | 9/2001 | Hsiao et al. | |
| 6,559,044 B1 | 5/2003 | Chen et al. | |
| 6,617,215 B1 | 9/2003 | Halliyal et al. | |
| 6,784,054 B2 * | 8/2004 | Nitta et al. ................. | 438/257 |

* cited by examiner

*Primary Examiner*—Dung A. Le
(74) *Attorney, Agent, or Firm*—Leffert Jay & Polglaze, PA

(57) ABSTRACT

Concurrently forming self-aligned silicides on word lines and contacts of a memory device facilitates reduced resistance and/or reduced device sizing. The word-line silicide is formed at a stage significantly later than in standard processing, decreasing concerns of thermal stability of the silicide, thus allowing the use of lower-resistance silicides. In addition, by forming contacts to drain and/or source regions prior to forming the silicide for the word lines, aspect ratios for the contact holes or trenches are reduced for a given pitch, thus improving effectiveness of processing to remove material from these holes and trenches or allowing the use of a smaller pitch. By providing a process for the application of a silicide in array source interconnects, a single array source interconnect can couple an entire row of memory cells, thereby reducing the number of contacts made to an array ground.

32 Claims, 10 Drawing Sheets

METHODS OF FORMING MEMORY CELLS HAVING SELF-ALIGNED SILICIDE

TECHNICAL FIELD OF THE INVENTION

The present invention relates generally to integrated circuit devices and, in particular, to the formation of self-aligned silicides for word lines and contacts of a semiconductor memory device.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Memory device fabricators are continuously seeking to reduce the size of the devices. Smaller devices facilitate higher productivity and reduced power consumption. However, as device sizes become smaller, resistance of the various conductors becomes an ever-increasing problem. High resistance can lead to slower performance. One solution is to utilize materials having higher conductivity.

For the reasons stated above, and for other reasons stated below which will become apparent to those skilled in the art upon reading and understanding the present specification, there is a need in the art for alternate methods and circuits for providing reduced resistance to portions of a semiconductor memory device.

SUMMARY OF THE INVENTION

The above-mentioned problems with memory devices and other problems are addressed by the present invention and will be understood by reading and studying the following specification.

Various embodiments of the invention facilitate reduced resistance and/or reduced device sizing by providing a process to concurrently form self-aligned silicides on word lines and contacts of a memory device. The word-line silicide is formed at a stage significantly later than in standard processing, decreasing concerns of thermal stability of the silicide, thus allowing the use of lower-resistance silicides. In addition, by forming contacts to drain and source regions prior to forming the silicide for the word lines, aspect ratios for the contact holes or trenches are reduced, thus improving effectiveness of processing to remove material from these holes and trenches or allowing the use of a smaller pitch, i.e., a smaller spacing between adjacent word lines. By providing a process for the application of a silicide in array source interconnects, a single array source interconnect can couple an entire row of memory cells, thereby reducing the number of contacts made to an array ground.

For one embodiment, the invention provides a method of fabricating a memory cell. The method includes forming a silicide layer on a word line of the memory cell concurrently with forming a silicide layer on a contact to a source/drain region of the memory cell. For a further embodiment, the method further includes forming the silicide layer on the word line of the memory cell concurrently with forming a silicide layer on a contact to each of a drain region of the memory cell and a source region of the memory cell.

For another embodiment, the invention provides a floating-gate memory cell. The memory cell includes a control-gate layer having a first silicide layer in contact with an underlying first polysilicon layer and a first contact having a second silicide layer in contact with an underling second polysilicon layer, the second polysilicon layer in contact with a source region of the memory cell. The first and second silicide layers are formed concurrently. For a further embodiment, the memory cell further includes a second contact to the drain region having a third silicide layer in contact with a third underlying polysilicon layer, the third underlying polysilicon layer in contact with the drain region. The third silicide layer is formed concurrently with the first and second silicide layers.

The invention further provides methods and apparatus of varying scope.

DETAILED DESCRIPTION OF THE INVENTION

In the following detailed description of the preferred embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and their equivalents.

Figure 1A:
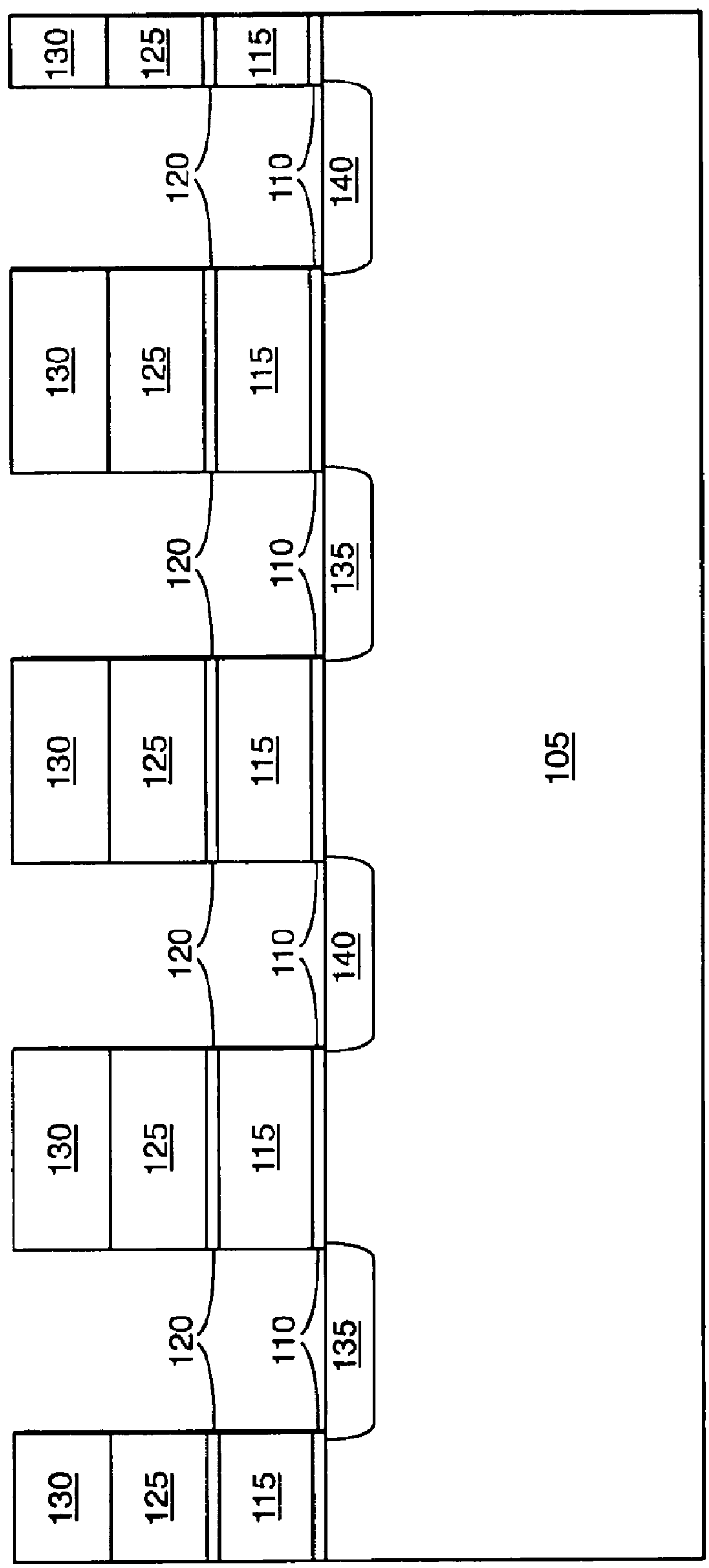
FIGS. 1A–1H are cross-sectional views of a portion of a memory array during various stages of fabrication in accordance with an embodiment of the invention.

FIGS. 1A–1H generally depict a method of forming a portion of a memory array in accordance with an embodiment of the invention. FIG. 1A depicts a portion of the memory array after several processing steps have occurred. Formation of the structure depicted in FIG. 1A is well known and will not be detailed herein. In general, FIG. 1A depicts several stacks of layers that will form word lines of the memory array. The stacks include a tunnel dielectric 110 is formed on a substrate 105. Tunnel dielectric 110 is generally a silicon oxide, but may be any dielectric material. Some specific examples include silicon oxides ($SiO/SiO_2$), silicon nitrides ($SiN/Si_2N/Si_3N_4$) and silicon oxynitrides ($SiO_xN_y$). For one embodiment, substrate 105 is a P-type silicon substrate. A first polysilicon layer 115 is formed over the tunnel dielectric 110. First polysilicon layer 115 will become the floating gate for this embodiment. First polysilicon layer 115 may be conductively doped. An example would be an n-type polysilicon layer.

An intergate dielectric layer 120 is formed over the first polysilicon layer 115. Dielectric layer 120 contains any dielectric layer. For one embodiment, the dielectric layer 120 contains the dielectric ONO (oxide-nitride-oxide). Other dielectric materials may be substituted for the ONO, such as tantalum oxide, barium strontium titanate, silicon nitride and other materials providing dielectric properties.

A second polysilicon layer 125 is formed overlying the dielectric layer 120. The second or control gate polysilicon layer 125 may also be conductively doped. A cap layer 130 is formed overlying the control gate polysilicon layer 125. For one embodiment, cap layer 130 is silicon nitride. However, cap layer 130 is a sacrificial layer and may be any material that can function as an etch or planarization stop layer and that is selective to removal over surrounding layers. The layers are patterned into stacks, as shown in FIG. 1A, and drain regions 135 and source regions 140 are formed in the substrate 105, such as by implantation or diffusion of dopant materials. The drain regions 135 and source regions 140 will have the same conductivity type and be different from the conductivity type of the substrate 105. The source/drain regions are also generally more heavily doped than the substrate 105. For one embodiment, the substrate 105 has a p-type conductivity while the drain regions 135 and source regions 140 have an n+-type conductivity. While the drain regions 135 and source regions 140 were formed after formation of the word line stack for this embodiment, they could also be formed earlier.

In a typical word line stack, a metal or metal silicide layer would be formed on the control gate polysilicon layer 125 prior to formation of the cap layer 130. By forming the cap layer 130 without the intervening metal or metal silicide layer, the stack for the future word lines can be shortened relative to a typical word line, thereby reducing the aspect ratio of the space between adjacent word lines. This reduced aspect ratio can provide advantages during subsequent fabrication as will be described below.

Figure 1B:
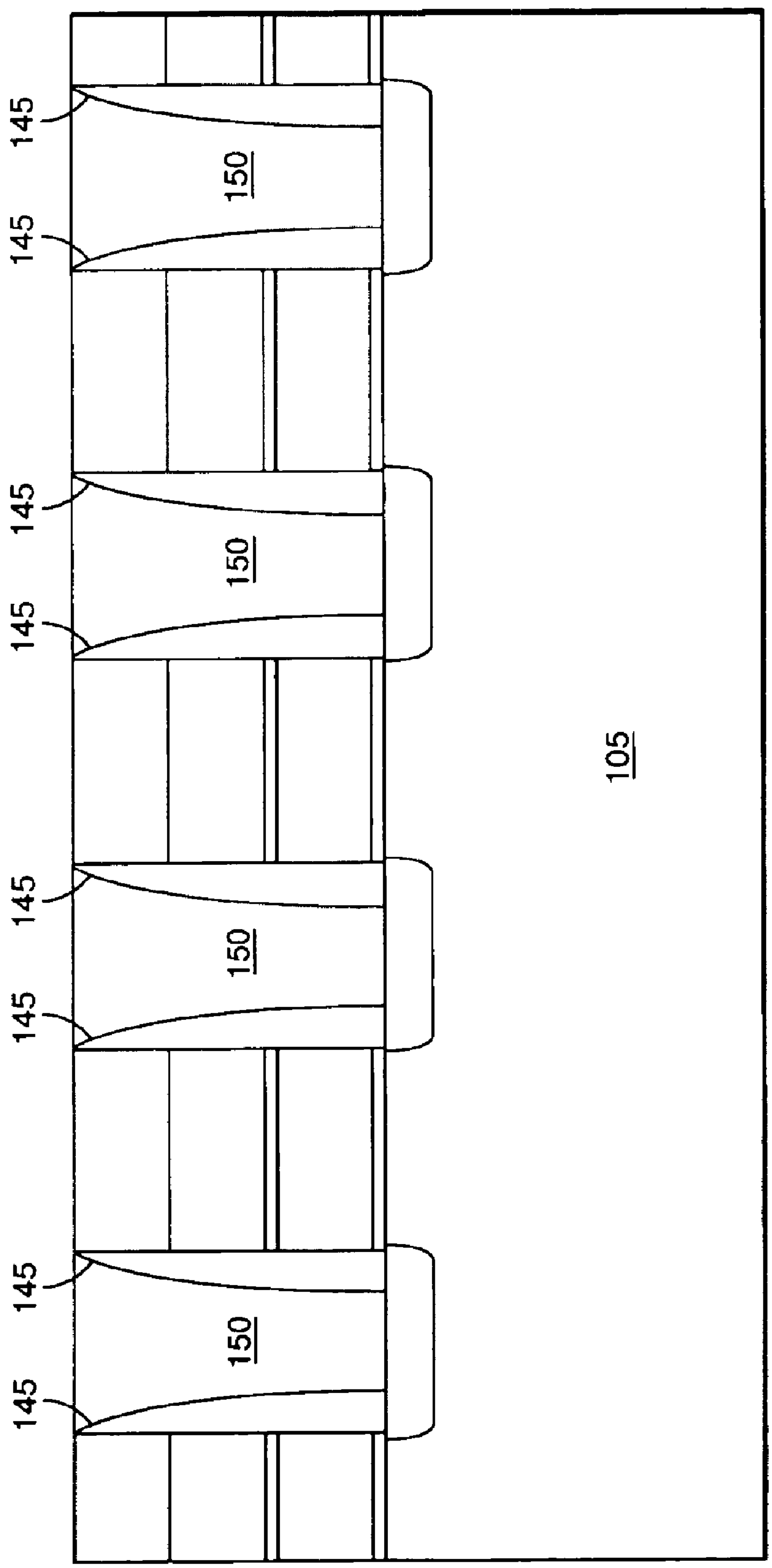

Following formation of the stacks as depicted in FIG. 1A, dielectric spacers 145 are formed on the sidewalls of the stacks as shown in FIG. 1B. The dielectric spacers 145 should contain a material different from the cap layer 130. In formation of the dielectric spacers 145, for one embodiment, a layer of dielectric material, such as TEOS (tetraethylorthosilicate), is formed by a blanket deposition process and the layer is anisotropically etched to leave behind the spacers 145. By selecting a material different than the cap layer 130, the cap layer 130 can act as an etch stop in the formation of the spacers 145.

An insulator layer 150 is then formed between the future word lines. The insulator layer 150 should contain a dielectric material that is selective over the materials of the substrate 105, the cap layer 130 and the spacers 145. This will permit subsequent removal of the insulator layer 150 where desired. One example for the insulator layer 150 would be a doped silicate glass. Examples of doped silicate glasses include as BSG (borosilicate glass), PSG (phosphosilicate glass) and BPSG (borophosphosilicate glass).

Figure 1C:
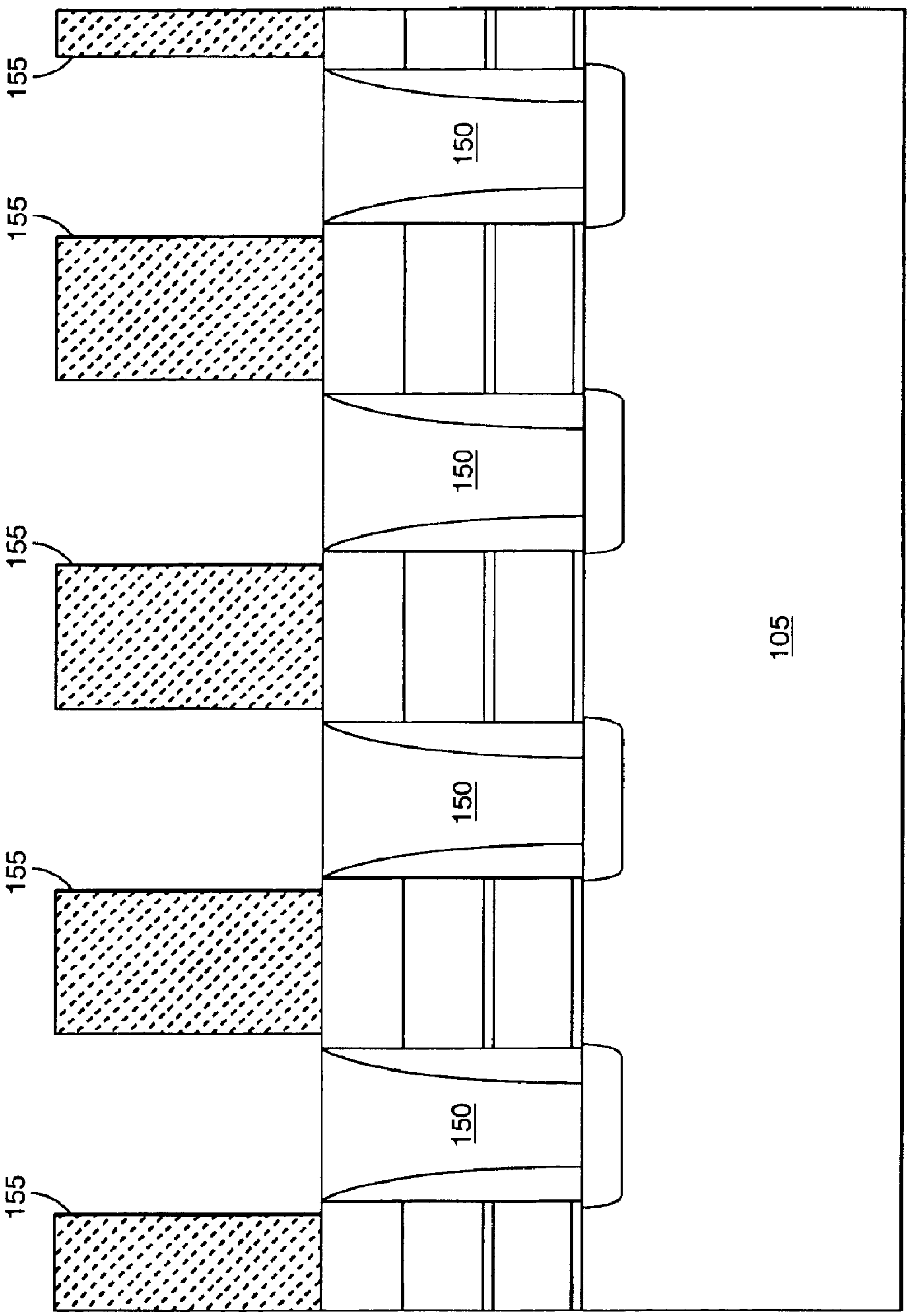
Figure 1D:
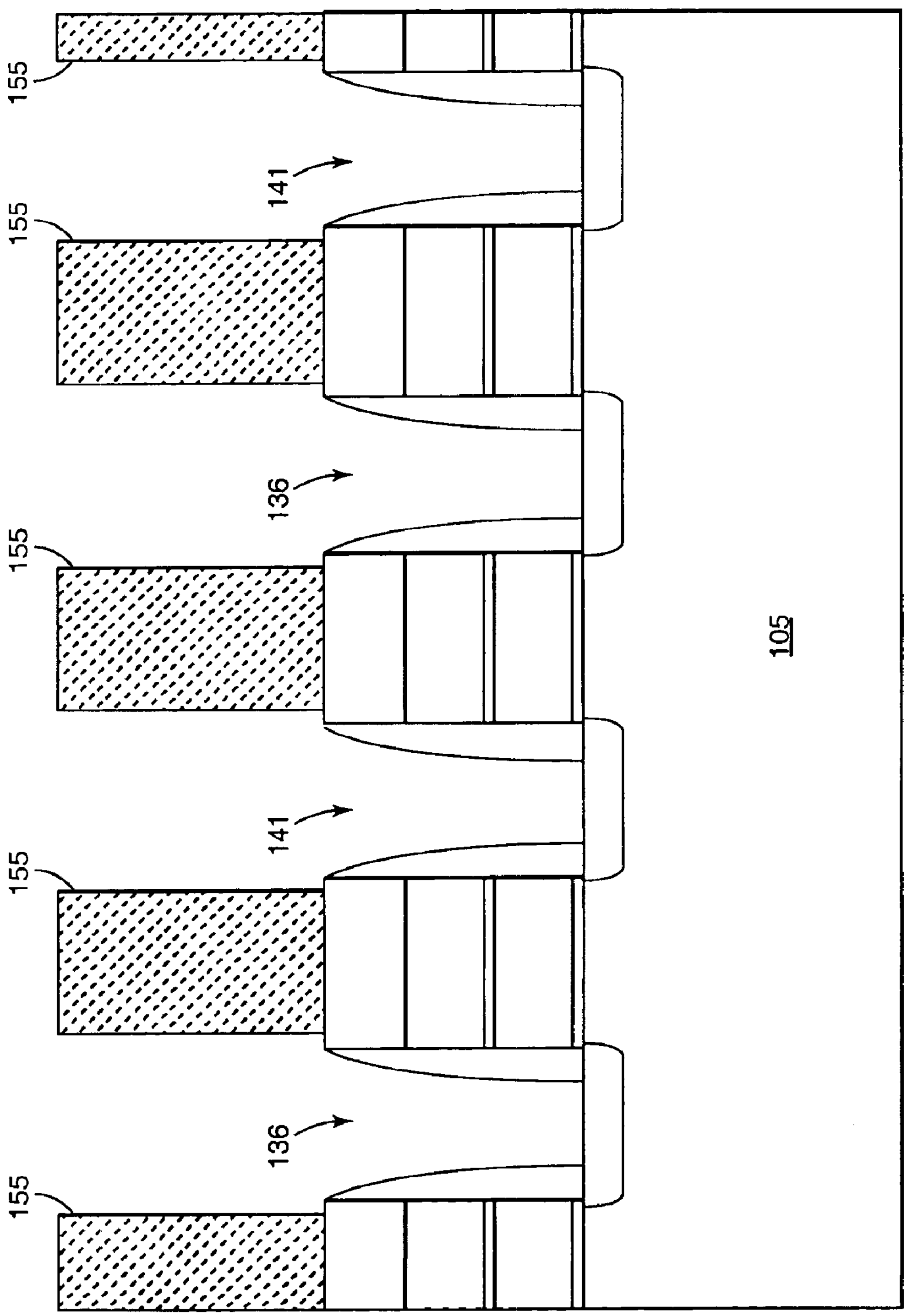

In FIG. 1C, a mask layer 155 is formed overlying the structure of FIG. 1B to define areas for removal of the insulator layer 150. As one example, the mask layer 155 is a patterned photoresist layer as is commonly used in semiconductor fabrication. While each portion of the insulator layer 150 that is visible in FIG. 1C is depicted to be exposed, it is noted that some areas of the insulator layer 150 will generally be left unexposed by the mask layer 155. The exposed areas of the insulator layer 150 are then removed in FIG. 1D such as by dry etching or other removal process. This exposes portions of the substrate 105 at one or more of the drain regions 135, forming contact holes 136, and one or more source regions 140, forming trenches 141. Alternatively, the contact holes 136 and trenches 141 may be formed separately using separate mask and etch steps. Because of the lower aspect ratio of the spaces containing the insulator layer 150 relative to a typical word line construction of the same pitch, clean removal of portions of the insulator layer 150 is relatively easier. Alternatively, a smaller pitch could be used to achieve the same aspect ratio.

Figure 1E:
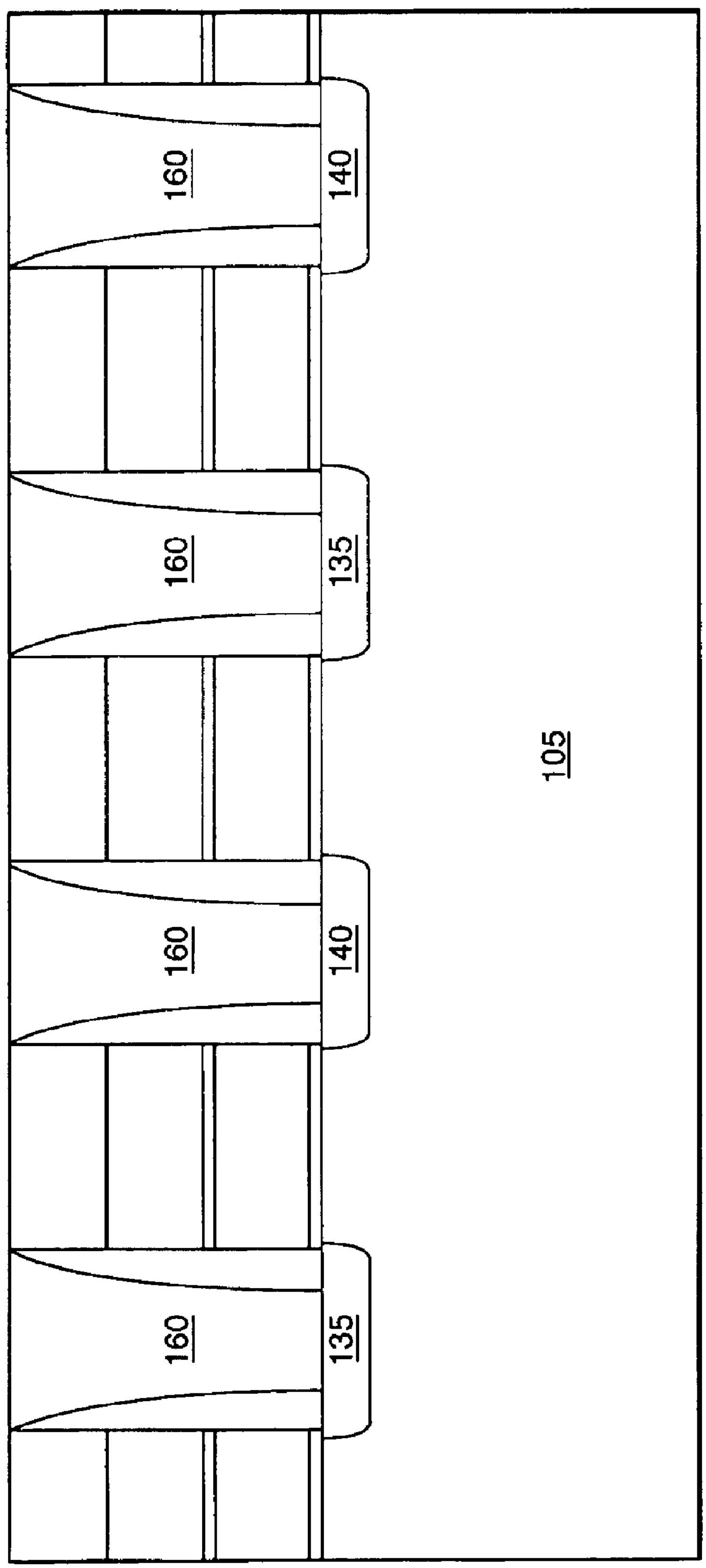

The holes 136 and trenches 141 exposed in the removal of portions of the insulator layer 150 are then filled with a conductively-doped polysilicon contact layer 160 as contacts to the drain regions 135 and source regions 140 as depicted in FIG. 1E. The mask layer 155 would generally be removed prior to filling the holes 136 and trenches 141. For one embodiment, a blanket layer of polysilicon is formed over the structure of FIG. 1D followed by a removal of excess polysilicon such as by CMP. The sacrificial cap layer 130 is then removed to leave the structure depicted in FIG. 1F. For one embodiment, removal of the cap layer 130 includes selective etching of the cap layer 130. Upon removal of the cap layer 130, portions of the contact layer 160 and the control gate layer 125 are exposed.

A self-aligned silicide (i.e., salicide) is formed on the exposed portions of the control gate layer 125 and the contact layer 160. In a salicide process, generally a layer of refractory metal, e.g., titanium (Ti), is formed overlying the entire structure and followed by an anneal. The metals of chromium (Cr), cobalt (Co), hafnium (Hf), molybdenum (Mo), niobium (Nb), tantalum (Ta), tungsten (W), vanadium (V) and zirconium (Zr) are generally recognized as other refractory metals. Where the refractory metal is in contact with a silicon layer, such as monocrystalline silicon or polysilicon, the refractory metal will react with the silicon to form a refractory metal silicide. Where the refractory metal is in contact with a layer not containing free silicon, e.g., silicon oxide, silicon nitride, TEOS, etc., the refractory metal will tend to remain unreacted during the anneal process. The unreacted refractory metal may then be selectively removed such as by a wet strip, leaving behind the refractory metal silicide portions.

Figure 1F:
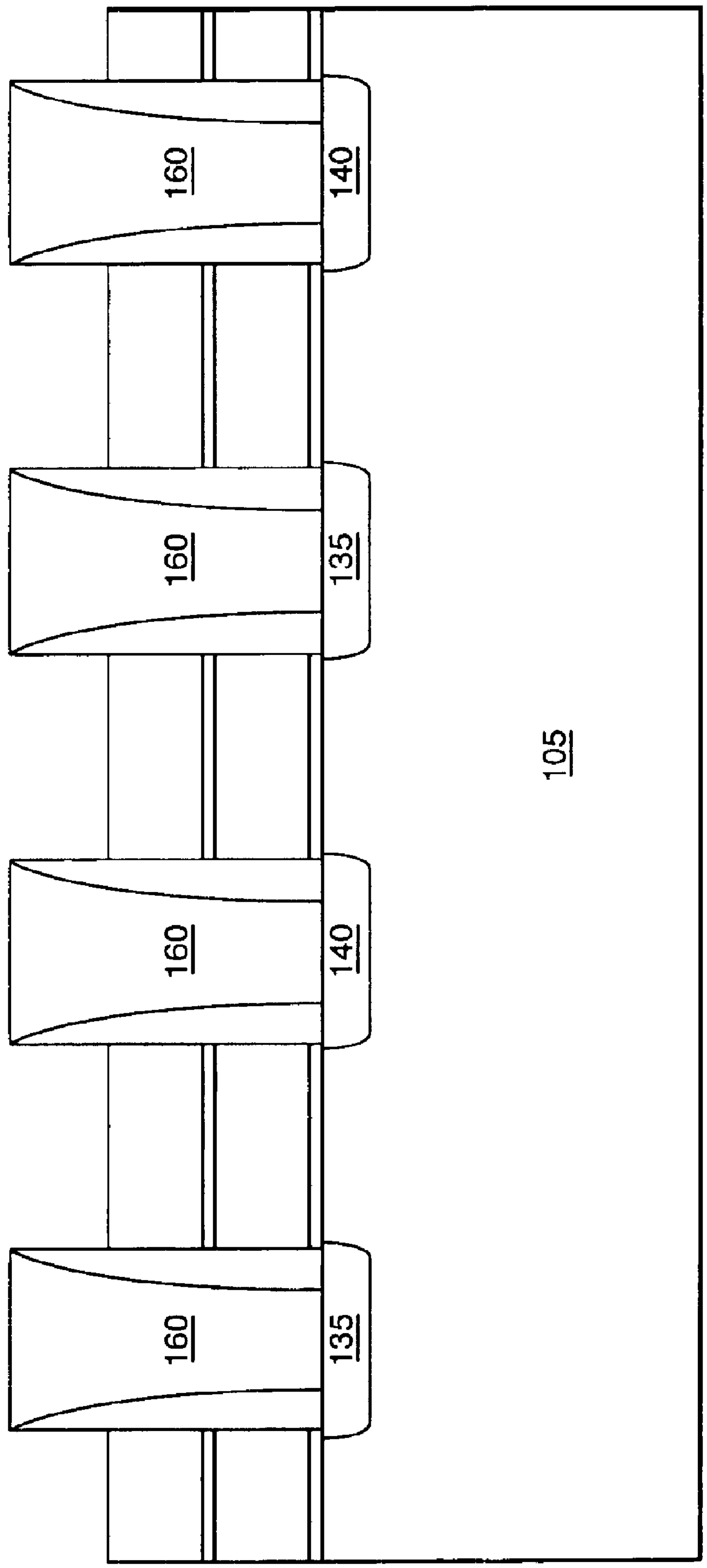
Figure 1G:
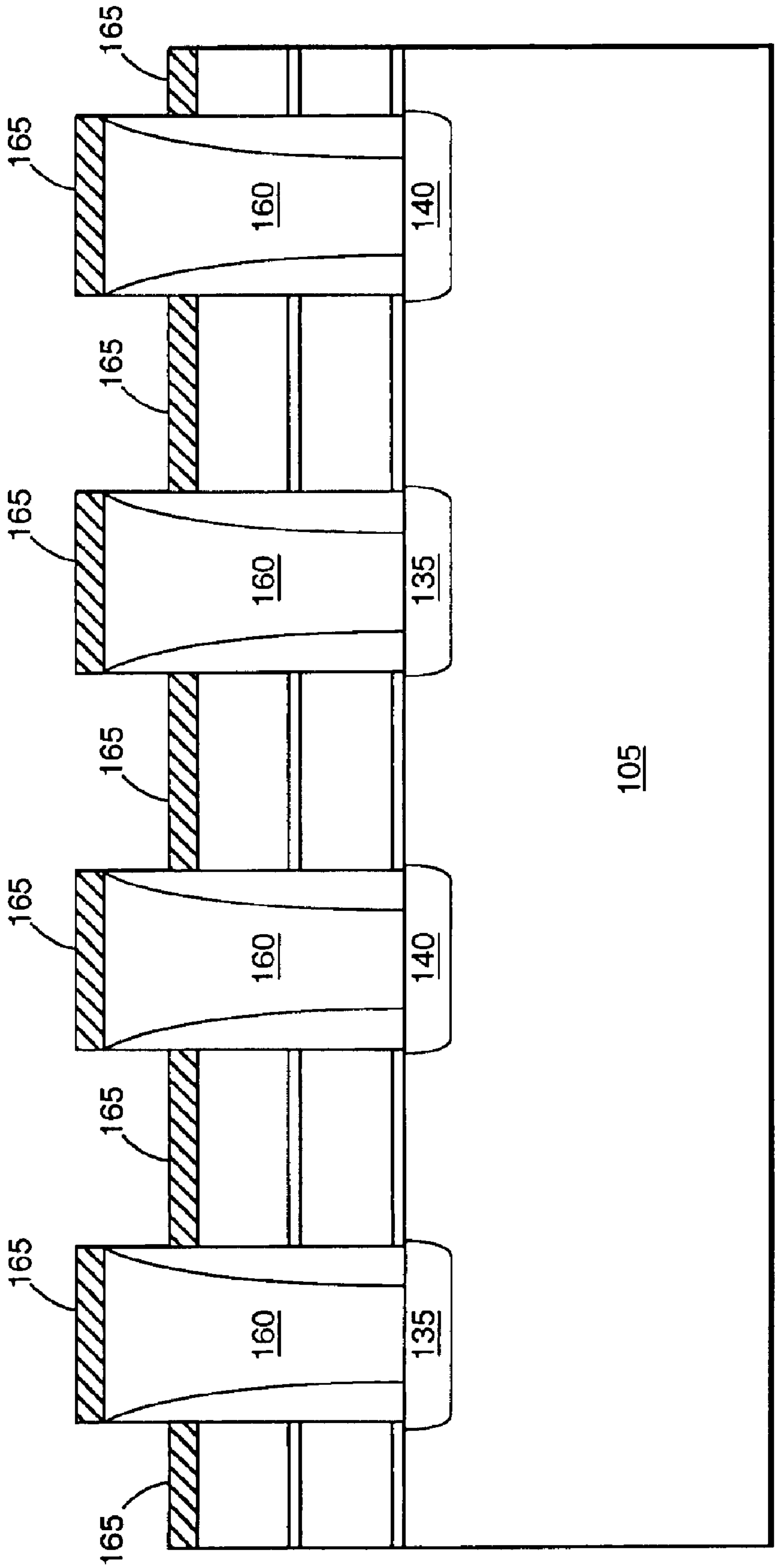

For the embodiment depicted in FIG. 1F, a silicide layer 165 would be formed on the exposed portions of the control gate layer 125 and contact layer 160 as depicted in FIG. 1G. Thus, the refractory metal overlying word lines, contacts to the drain regions and interconnects to the source regions will react to form silicide while the refractory metal overlying interposing structures, e.g., spacers, will remain unreacted. Because the silicide layer 165 is formed so much later in the processing than with typical word line fabrication, the silicide layer 165 will be exposed to less processing at elevated temperatures. This will permit the use of silicides having lower thermal budgets, but higher conductivity. For example, titanium silicide and cobalt silicide would be preferred over tungsten silicide for their reduced resistance, but tungsten silicide may be required in a typical word line, i.e., silicide layer formed prior to formation of the cap layer, where the expected heat load for subsequent processing exceeds the thermal budget of lower resistivity silicides. Similarly, regardless of the refractory metal chosen, by forming the silicide layer later in processing, the silicide layer will be less thermally stressed than a silicide layer formed prior to forming the cap layer 130.

Figure 1H:
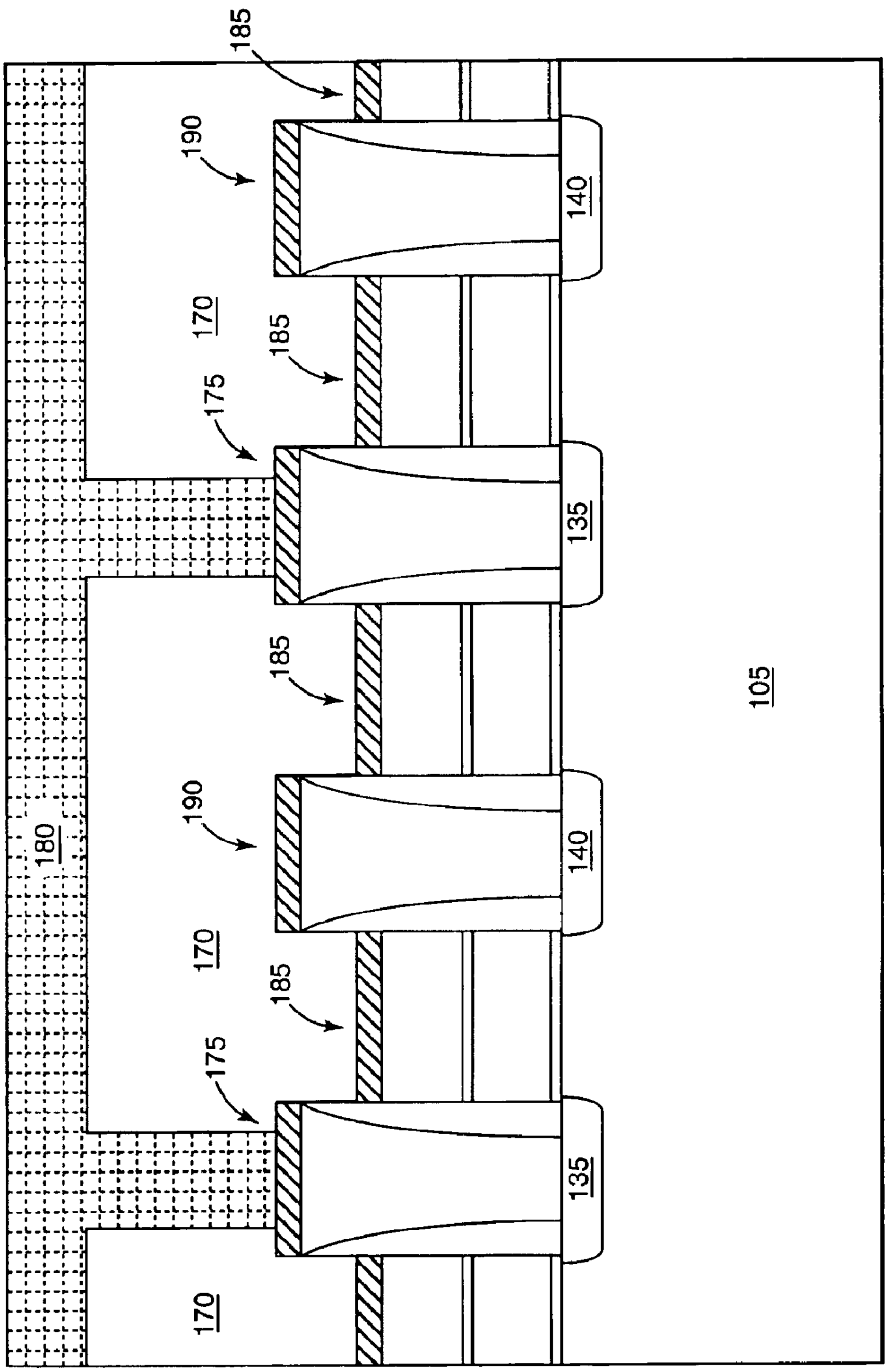

Following formation of the silicide layer 165, a bulk insulator layer 170 is formed overlying the structure and connections are made between drain contacts 175 and bit lines 180 as shown in FIG. 1H. Connections (not shown) will also be made to the word lines 185 and array source interconnects 190. However, while a drain contact 175 will generally be a single contact shared between two adjacent memory cells, word lines 185 and array source interconnects 190 will generally extend across multiple memory cells in a direction that is perpendicular to a face plane of the figure. For one embodiment, the array source interconnects 190 extend to the same number of columns as their associated word lines 185.

It is not uncommon for word lines 185 to be shared by hundreds of memory cells. In a typical flash memory device, an array source may be formed as a deep heavily-doped junction in the substrate shared by 32 memory cells, i.e., extending only 16 columns before coupling to the nearest array ground. Note that this could mean a span of 32 columns with a coupling to an array ground at each end of the span. In embodiments of the invention, by utilizing a shared silicide layer for reduced resistance, the source interconnect 190 can extend over a much larger group of memory cells. This configuration can facilitate array source interconnects extending 32 columns or more without coupling to an array ground, i.e., a span of 64 columns, and may extend as deep as the adjacent word lines 185, i.e., an entire row of memory cells. In addition, by utilizing a shallow junction for the source region 140, a smaller channel can be utilized in the memory array, thus facilitating a reduction in device size and a reduction in pitch. Connections to the word lines 185 and source interconnects 190 can thus be made once per row of memory cells. As described herein, a memory cell is a single floating-gate transistor formed of a word line 185, drain region 135, source region 140 and a channel region defined by the area interposed between the drain region 135 and source region 140.

Figure 2:
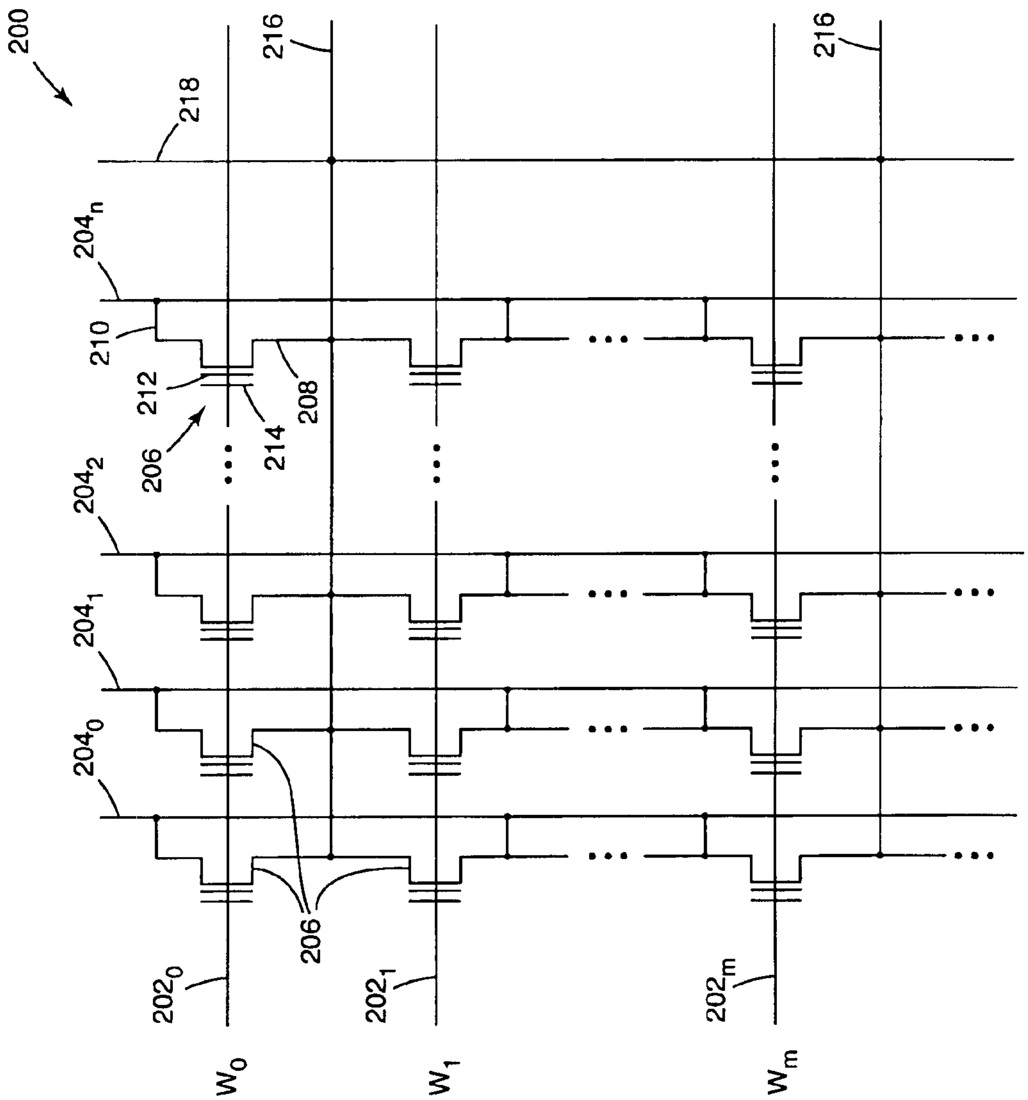
FIG. 2 is a schematic of a portion of a non-volatile memory array in accordance with an embodiment of the invention.

FIG. 2 is a schematic of a portion of a non-volatile memory array 200 as a portion of a memory device in accordance with one embodiment of the invention. The detail of memory array 200 is provided to better understand the various embodiments of the invention. The memory array 200 includes word lines and contacts formed in accordance with an embodiment of the invention.

The layout of FIG. 2 corresponds to one example of a NOR flash architecture. However, other types of memory arrays can benefit from embodiments of the invention. As one example, word lines, drain contacts and source interconnects can be fabricated in accordance with the invention for NAND flash architectures as well, although only one drain contact is required per string and only one source interconnect is required per block. Accordingly, the invention is not limited to the specific layout described with reference to FIG. 2.

As shown in FIG. 2, the memory block 200 includes word lines 202 and intersecting local bit lines 204. For ease of addressing in the digital environment, the number of word lines 202 and the number of bit lines 204 are each some power of two, e.g., 256 word lines 202 by 4,096 bit lines 204. The local bit lines 204 may be selectively coupled to global bit lines (not shown) for coupling to sense amplifiers (not shown in FIG. 2).

Floating-gate transistors 206 are located at each intersection of a word line 202 and a local bit line 204. The floating-gate transistors 206 represent the non-volatile memory cells for storage of data. Typical construction of such floating-gate transistors 206 include a source 208 and a drain 210 constructed from an $n^+$-type material of high impurity concentration formed in a P-type semiconductor substrate of low impurity concentration, a channel region formed between the source and drain, a floating gate 212, and a control gate 214. Floating gate 212 is isolated from the channel region by a tunneling dielectric and from the control gate 214 by an intergate dielectric. Floating-gate transistors 206 having their control gates 214 coupled to a word line 202 typically share a common source 208 depicted as array source interconnect 216. As shown in FIG. 2, floating-gate transistors 206 coupled to two adjacent word lines 202 may share the same array source interconnect 216. Floating-gate transistors 206 have their drains coupled to a local bit line 204. A column of the floating-gate transistors 206 are those transistors commonly coupled to a given local bit line 204. A row of the floating-gate transistors 206 are those transistors commonly coupled to a given word line 202.

The array source interconnects 216 may be coupled to a metal or other highly conductive line to provide a shared path to a ground potential node. The array ground 218 serves as this shared path. For one embodiment, a connection between an array source interconnect 216 and the array ground 218 occurs only once for each row of memory cells 206. Typical memory devices may make require a contact between an array source interconnect and an array ground every 16 columns.

Figure 3:
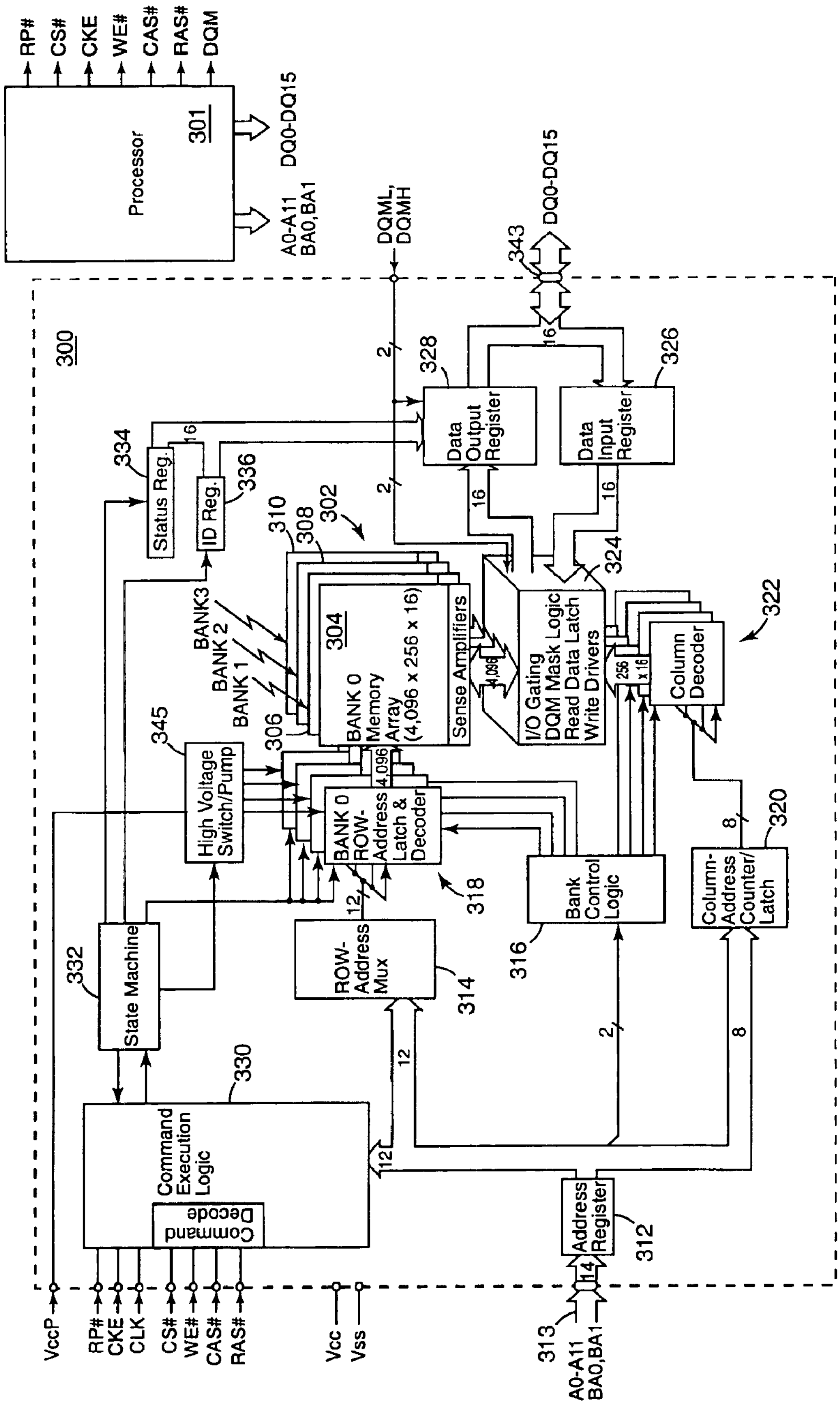
FIG. 3 is a functional block diagram of a basic flash memory device in accordance with an embodiment of the invention coupled to a processor.

FIG. 3 is a functional block diagram of a basic flash memory device 300 that is coupled to a processor 301. The memory device 300 and the processor 301 may form part of an electronic system. The memory device 300 has been simplified to focus on features of the memory that are helpful in understanding the present invention. The memory device 300 includes an array of non-volatile memory cells 302. The memory array 302 includes word lines and contacts formed in accordance with an embodiment of the invention.

Each memory cell is located at an intersection of a word line and a local bit line. The memory array 302 is arranged in rows and columns, with the rows arranged in blocks. A memory block is some discrete portion of the memory array 302. Individual word lines generally extend to only one memory block while bit lines may extend to multiple memory blocks. The memory cells generally can be erased in blocks. Data, however, may be stored in the memory array 302 separate from the block structure.

The memory array 302 is arranged in a plurality of addressable banks. In one embodiment, the memory contains four memory banks 304, 306, 308 and 310. Each memory bank contains addressable sectors of memory cells. The data stored in the memory can be accessed using externally provided location addresses received by address register 312 from processor 301 on address lines 313. The addresses are decoded using row address multiplexer circuitry 314. The addresses are also decoded using bank control logic 316 and row address latch and decode circuitry 318.

To access an appropriate column of the memory, column address counter and latch circuitry 320 couples the received addresses to column decode circuitry 322. Circuit 324 provides input/output gating, data mask logic, read data latch circuitry and write driver circuitry. Data is input through data input registers 326 and output through data output registers 328. This bi-directional data flow occurs over data (DQ) lines 343.

Command execution logic 330 is provided to control the basic operations of the memory device including memory read operations. A state machine 332 is also provided to control specific operations performed on the memory arrays and cells. A high voltage switch and pump circuit 345 is provided to supply higher voltages during erase and write operations. A status register 334 and an identification register 336 can also be provided to output data.

The memory device 300 can be coupled to an external memory controller, or processor 301, to receive access commands such as read, write and erase command. Other memory commands can be provided, but are not necessary to understand the present invention and are therefore not outlined herein. The memory device 300 includes power supply inputs Vss and Vcc to receive lower and upper voltage supply potentials.

As stated above, the flash memory device 301 has been simplified to facilitate a basic understanding of the features of the memory device. A more detailed understanding of flash memories is known to those skilled in the art. As is well known, such memory devices 301 may be fabricated as integrated circuits on a semiconductor substrate.

CONCLUSION

Method and apparatus have been described to facilitate reduced resistance and/or reduced device sizing by concurrently forming self-aligned silicides on word lines and contacts of a memory device. The word-line silicide is formed at a stage significantly later than in standard processing, decreasing concerns of thermal stability of the silicide, thus allowing the use of lower-resistance silicides. In addition, by forming contacts to drain and source regions prior to forming the silicide for the word lines, aspect ratios for the contact holes or trenches are reduced, thus improving effectiveness of processing to remove material from these holes and trenches or allowing the use of a smaller pitch. By providing a process for the application of a silicide in array source interconnects, a single array source interconnect can couple an entire row of memory cells, thereby reducing the number of contacts made to an array ground.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of fabricating a memory cell, comprising: forming a silicide layer on a word line of the memory cell concurrently with forming a silicide layer on a contact to a source/drain region of the memory cell; wherein the silicide layer formed on the word line is not limited by a width of the contact.

2. The method of claim 1, wherein forming a silicide layer comprises forming a self-aligned silicide layer.

3. The method of claim 1, wherein forming a silicide layer further comprises forming a layer of silicide selected from the group consisting of chromium silicide, cobalt silicide, hafnium silicide, molybdenum silicide, niobium silicide, tantalum silicide, titanium silicide, tungsten silicide, vanadium silicide and zirconium silicide.

4. The method of claim 1, wherein forming a silicide layer further comprises forming a layer of silicide selected from the group consisting of titanium silicide and cobalt silicide.

5. The method of claim 1, further comprising forming the silicide layer on the word line of the memory cell concurrently with forming a silicide layer on a contact to each of a drain region of the memory cell and a source region of the memory cell.

6. A method of fabricating an array of floating-gate memory cells, comprising:

forming a layer of silicide on exposed portions of one or more word lines of the array, each word line extending to a plurality of columns of the array;

while forming the layer of silicide on the exposed portions of the one or more word lines, forming a layer of silicide on one or more contacts to drain regions of the memory cells; and while forming the layer of silicide on the exposed portions of the one or more word lines, forming a layer of silicide on one or more interconnects to source regions of the memory cells, wherein each interconnect contacts source regions of memory cells of one or more columns of the array;

wherein the exposed portions of the one or more word lines are independent of the contacts and interconnects.

7. The method of claim 6, wherein each interconnect contacts source regions to memory cells of the same number of columns as an associated word line.

8. The method of claim 6, wherein forming the layer of silicide on the exposed portions of the one or more word lines of the array, forming the layer of silicide on the one or more contacts to drain regions of the memory cells and forming the layer of silicide on the one or more interconnects to source regions of the memory cells further comprises:

forming a layer of refractory metal on the exposed portions of the word lines, contacts to drain regions, interconnects to source regions and interposing structures;

reacting the refractory metal with free silicon in the word lines, contacts to drain regions and interconnects to source regions; and removing unreacted refractory metal from the interposing structures.

9. The method of claim 8, wherein forming the layer of refractory metal further comprises forming a layer of refractory metal selected from the group consisting of chromium, cobalt, hafnium, molybdenum, niobium, tantalum, titanium, tungsten, vanadium and zirconium.

10. The method of claim 8, wherein forming the layer of refractory metal further comprises forming a layer containing cobalt or titanium.

11. A method of forming a floating-gate memory cell, comprising:

forming a word line stack, comprising:

forming a tunnel dielectric layer overlying a semiconductor substrate;

forming a floating-gate layer overlying the tunnel dielectric layer;

forming an intergate dielectric layer overlying the floating-gate layer;

forming a polysilicon control gate layer overlying the intergate dielectric layer; and forming a sacrificial cap layer overlying the polysilicon control gate layer;

forming dielectric spacers on sidewalls of the word line stack;

forming a drain region in the substrate on a first side of the word line stack;

forming a source region in the substrate on a second side of the word line stack;

forming a first polysilicon contact to the source region;

removing the cap layer, thereby exposing the polysilicon control gate layer; and forming silicide layers concurrently on the polysilicon control gate layer and the first polysilicon contact.

12. The method of claim 11, wherein the drain and source regions are formed after forming the word line stack.

13. The method of claim 11, wherein:

forming the sacrificial cap layer further comprises forming the sacrificial cap layer of a first dielectric material; and forming the dielectric spacers further comprises forming the dielectric spacers of a second dielectric material different from the first dielectric material.

14. The method of claim 11, wherein forming the first polysilicon contact further comprises:

forming an insulator layer overlying the word line stack, the drain region and the source region;

removing a first portion of the insulator layer to expose the cap layer;

removing a second portion of the insulator layer to expose the source region;

forming a polysilicon layer in contact with the source region.

15. The method of claim 14, wherein removing the first portion of the insulator further comprises planarizing the insulator layer using the cap layer as a stop layer.

16. The method of claim 15, wherein removing the second portion of the insulator layer further comprises forming a mask overlying the planarized insulator layer to expose portions of the insulator layer to be removed and etching the exposed portions of the insulator layer to expose the source region.

17. The method of claim 11, further comprising:

forming a second polysilicon contact to the drain region; and forming silicide layers concurrently on the polysilicon control gate layer, the first polysilicon contact and the second polysilicon contact.

18. The method of claim 17, wherein forming the first polysilicon contact and forming the second polysilicon contact further comprises:

forming an insulator layer overlying the word line stack, the drain region and the source region;

removing a first portion of the insulator layer to expose the cap layer;

removing a second portion of the insulator layer as a contact hole to expose the drain region;

removing a third portion of the insulator layer as a trench to expose the source region;

forming a polysilicon layer filling the contact hole and the trench.

19. The method of claim 18, wherein forming the polysilicon layer further comprises forming a blanket layer of polysilicon and planarizing the blanket layer of polysilicon using the cap layer as a stop layer.

20. The method of claim 11, wherein:

forming the sacrificial cap layer further comprises forming the sacrificial cap layer of a first dielectric material; and forming the dielectric spacers further comprises forming the dielectric spacers of a second dielectric material different from the first dielectric material.

21. A method of forming an array of floating-gate memory cells, comprising:

forming a first dielectric layer on a silicon substrate;

forming a first polysilicon layer on the first dielectric layer;

forming a second dielectric layer on the first polysilicon layer;

forming a second polysilicon layer on the second dielectric layer;

forming a third dielectric layer on the second polysilicon layer;

patterning the first dielectric layer, the first polysilicon layer, the second dielectric layer, the second polysilicon layer and the third dielectric layer to define word line stacks;

forming source and drain regions between adjacent word line stacks;

forming dielectric spacers on sidewalls of the word line stacks;

forming an insulator layer between adjacent word line stacks;

removing a portion of the insulator layer to define contact holes exposing drain regions and trenches exposing source regions, wherein each contact hole exposes one drain region and wherein each trench exposes a plurality of source regions;

filling the contact holes and trenches with a third polysilicon layer;

removing the third dielectric layer, thereby exposing the second polysilicon layer;

forming a silicide layer on the second polysilicon layer; and forming a silicide layer on the third polysilicon layer.

22. The method of claim 21, wherein forming the source and drain regions occurs prior to patterning the first dielectric layer, the first polysilicon layer, the second dielectric layer, the second polysilicon layer and the third dielectric layer.

23. The method of claim 21, wherein the third dielectric layer, the dielectric spacers and the insulator layer each contain a different dielectric material.

24. The method of claim 23, wherein the third dielectric layer comprises a silicon nitride, the dielectric spacers comprise tetraethylorthosilicate and the insulator layer comprises a doped silicate glass.

25. The method of claim 24, wherein the doped silicate glass comprises borophosphosilicate glass.

26. The method of claim 21, wherein forming the silicide layer on the second polysilicon layer occurs concurrently with forming the silicide layer on the third polysilicon layer.

27. The method of claim 21, wherein forming the silicide layer on the second polysilicon layer and forming the silicide layer on the third polysilicon layer further comprise forming a self-aligned silicide layer on the second and third polysilicon layers.

28. The method of claim 27, wherein forming the self-aligned silicide layer on the second and third polysilicon layers further comprises forming a self-aligned silicide layer using a refractory metal selected from the group consisting of chromium, cobalt, hafnium, molybdenum, niobium, tantalum, titanium, tungsten, vanadium and zirconium.

29. The method of claim 27, wherein forming the self-aligned silicide layer on the second and third polysilicon layers further comprises forming a self-aligned silicide layer using a refractory metal selected from the group consisting of cobalt and titanium.

30. The method of claim 21, wherein removing a portion of the insulator layer to define trenches exposing source regions further comprises exposing source regions along an entire length of a word line stack.

31. The method of claim 21, further comprising:

forming a bit line coupled to drain regions of a column of memory cells, wherein the bit line is individually coupled to each drain region of the column of memory cells;

forming at least one contact to a word line stack of a row of memory cells; and forming at least one contact to source regions of the row of memory cells.

32. The method of claim 31, further comprising:

forming only one contact to the word line stack of the row of memory cells; and forming only one contact to the source regions of the row of memory cells.

* * * * *